United States Patent
Kamogawa et al.

(10) Patent No.: US 8,404,046 B2
(45) Date of Patent: Mar. 26, 2013

(54) SINGLE CRYSTAL SILICON PULLING APPARATUS, METHOD FOR PREVENTING CONTAMINATION OF SILICON MELT, AND DEVICE FOR PREVENTING CONTAMINATION OF SILICON MELT

(75) Inventors: Makato Kamogawa, Omura (JP); Koichi Shimomura, Omura (JP); Yoshiyuki Suzuki, Omura (JP); Daisuke Ebi, Omura (JP)

(73) Assignee: Sumco Techxiv Corporation, Nagasaki (JP)

( * ) Notice: Subject to any disclaimer, the term of this patent is extended or adjusted under 35 U.S.C. 154(b) by 1392 days.

(21) Appl. No.: 11/992,278

(22) PCT Filed: Jun. 27, 2006

(86) PCT No.: PCT/JP2006/312791
§ 371 (c)(1),
(2), (4) Date: Mar. 18, 2008

(87) PCT Pub. No.: WO2007/037052
PCT Pub. Date: Apr. 5, 2007

(65) Prior Publication Data
US 2009/0229512 A1 Sep. 17, 2009

(30) Foreign Application Priority Data
Sep. 27, 2005 (JP) ................................. 2005-279979

(51) Int. Cl.
*C30B 35/00* (2006.01)
*C30B 15/00* (2006.01)

(52) U.S. Cl. ............ 117/218; 117/13; 117/34; 117/200; 117/206; 117/217; 117/222

(58) Field of Classification Search .................... 117/13, 117/200, 34, 206, 217, 218, 222
See application file for complete search history.

(56) References Cited

U.S. PATENT DOCUMENTS

| 6,036,776 A | 3/2000 | Kotooka et al. |
| 6,117,402 A * | 9/2000 | Kotooka et al. ............ 422/245.1 |
| 6,482,263 B1 | 11/2002 | Ferry |
| 2002/0100410 A1* | 8/2002 | Kim et al. ........................ 117/13 |

(Continued)

FOREIGN PATENT DOCUMENTS

| DE | 101 54 527 A1 | 5/2003 |
| JP | 05-238883 | 9/1993 |

(Continued)

OTHER PUBLICATIONS

Machine translation of Sonokawa, JP, 2002-321997, 2002.*

(Continued)

*Primary Examiner* — Matthew Song
(74) *Attorney, Agent, or Firm* — Husch Blackwell LLP

(57) ABSTRACT

A velocity of Ar gas flow passing through between a lower end of a cylindrical body and a thermal shielding body is influenced by arrangement of a pulling path of single crystal silicon, a cylindrical body, and a thermal shielding body. Accordingly, the velocity of the Ar gas flow passing through between a lower end of the cylindrical body and the thermal shielding body is controlled by adjusting a relative position of the pulling path of the single crystal silicon, the cylindrical body, and the thermal shielding body. As described above, dust falling off to silicon melt can be reduced, thereby preventing deterioration in quality of the single crystal silicon.

2 Claims, 7 Drawing Sheets

U.S. PATENT DOCUMENTS

2002/0139298 A1* 10/2002 Okui et al. .................... 117/213
2003/0154907 A1* 8/2003 Inagaki et al. .................. 117/19

FOREIGN PATENT DOCUMENTS

| | | | |
|---|---|---|---|
| JP | 06-122587 | * | 5/1994 |
| JP | 06-219886 A | | 8/1994 |
| JP | 09-235190 | | 9/1997 |
| JP | 2002-321997 | | 11/2002 |

OTHER PUBLICATIONS

German Patent Office issued on Dec. 30, 2010 for related application.
International Search Report regarding PCT/JP2006/31279.
US Office Action for related U.S. Appl. No. 13/474,268 dated Oct. 19, 2012.

* cited by examiner

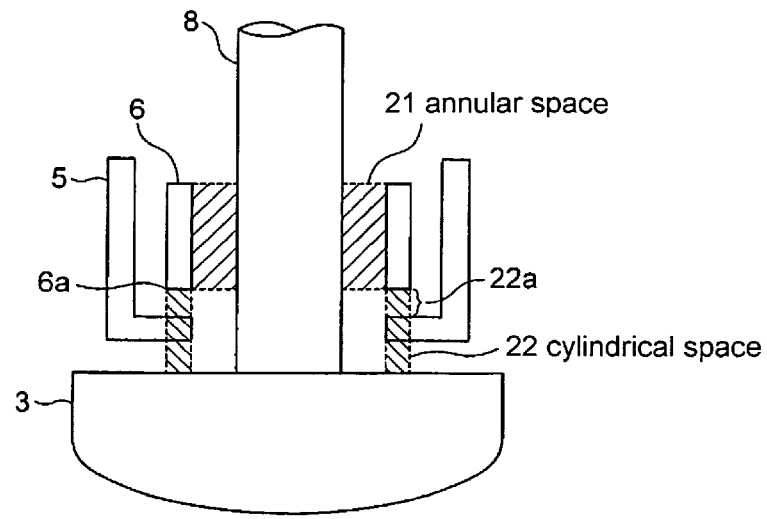
FIG. 2A
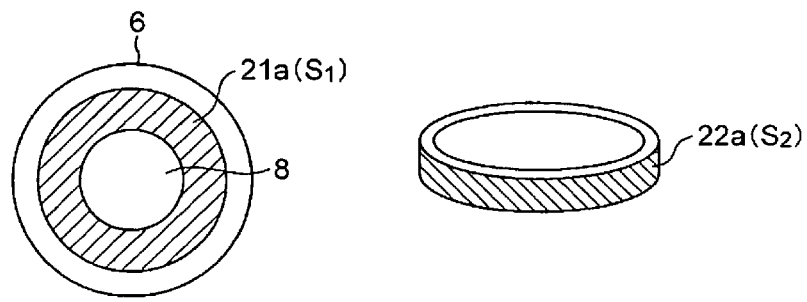
FIG. 2B   FIG. 2C

SINGLE CRYSTAL SILICON PULLING APPARATUS, METHOD FOR PREVENTING CONTAMINATION OF SILICON MELT, AND DEVICE FOR PREVENTING CONTAMINATION OF SILICON MELT

TECHNICAL FIELD

The present invention relates to a single crystal silicon pulling device, a method for preventing contamination of silicon melt and a device for preventing contamination of silicon melt, for preventing the silicon melt from contaminating due to dust falling from a thermal shielding body to the silicon melt.

BACKGROUND ART

FIG. 1 is a schematic view of a single crystal silicon pulling device.

A single crystal silicon pulling device 10 is provided, in a furnace 1 thereof, with a heat insulator 2 that is provided inside an inner wall of the furnace 1 and insulates heat transfer from the inside/outside of the furnace 1; a crucible 3 that maintains a silicon material such as polycrystalline silicon and in which the silicon melt obtained after the silicon raw material is melted is reserved; a heater 4 that is arranged so as to surround the crucible 3 and heats the silicon material by way of the crucible 3; and a thermal shielding body 5 that is arranged above the crucible 3 so as to surround a pulling path of a single crystal silicon 8.

Additionally, a cooling coil 6 may be provided above the crucible 3 so as to surround the pulling path of the single crystal silicon 8. The cooling coil 6 is formed such that a pipe in which cooling water flows is coiled in a helical shape, and has a cylindrical shape as a whole. The cooling coil 6 is arranged above the crucible 3 such that the pulling path of the crystal is positioned inside the coil. By increasing the cooling rate of the single crystal silicon 8 through the cooling coil 6, quality of the crystal can be improved due to the fact that the size of the hole type defect included in the single crystal silicon 8, namely, COP becomes small. Additionally, the production cycle can be accelerated, thereby improving the production efficiency. It should be noted that, in a case of controlling oxygen precipitation or of improving the oxide film pressure resistance characteristic, a cylindrical-shaped heater or a purge tube may be provided in place of the cooling coil 6 to approximately the same location as the cooling coil.

Here, a procedure of a manufacturing process of the single crystal silicon using the single crystal silicon pulling device 10 will be briefly described. The silicon material is put into the crucible 3 and the heater 4 is activated. The silicon material is heated and melted, and then the silicon melt is generated. A seed crystal of silicon is immersed into the generated silicon melt. By pulling up the immersed seed crystal, the single crystal silicon 8 is grown around the seed crystal. During pulling up the single crystal silicon 8, a pulling up speed, location of the thermal shielding body 5, and the like are adjusted. Furthermore, by making the cooling water flow in the pipe of the cooling coil 6, the single crystal silicon 8 is forcefully cooled.

Ar gas is supplied from above in the furnace 1 during the growth of the single crystal silicon 8. FIGS. 5A and 5B are diagrams showing gas flows in a general furnace. FIG. 5A shows a gas flow during the early stages of growth of the single crystal silicon. FIG. 5B shows a gas flow after the early stages of growth of the single crystal silicon.

As shown in FIG. 5A, during the early stages of growth of the single crystal silicon, the Ar gas supplied from above in the furnace 5 passes through the inside of the cooling coil 6 and falls down to the vicinity of the silicon melt. Furthermore, the Ar gas passes down between the crucible 3 and the heater 4, and drains from a gas outlet 1a provided in the lower part of the furnace 1 to the outside of the furnace 1. Additionally, after passing through the inside of the cooling coil 6, part of the Ar gas supplied from above in the furnace 5 passes through between a lower end 6a of the cooling coil 6 and the thermal shielding body 5, moves upward through between the cooling coil 6 and the thermal shielding body 5, and then merges with Ar gas supplied from above in the furnace 5.

As shown in FIG. 5B, after the early stages of growth of the single crystal silicon, part of the Ar gas supplied from above in the furnace 5 passes through the inside of the cooling coil 6, in other words, a space between the cooling coil 6 and the single crystal silicon 8 and falls down to the vicinity of the silicon melt. Furthermore, the Ar gas passes down between the crucible 3 and the heater 4, and drains from a gas outlet 1a provided in the lower part of the furnace 1 to the outside of the furnace 1. Additionally, part of the Ar gas supplied from above in the furnace 5 falls down between the cooling coil 6 and the thermal shielding body 5, passes through between the lower end 6a of the cooling coil 6 and the thermal shielding body 5, and then merges with the Ar gas passing through the inside of the cooling coil 6.

DISCLOSURE OF THE INVENTION

Problems to be Solved by the Invention

As shown in FIGS. 5A and 5B, the Ar gas flowing between the lower end 6a of the cooling coil 6 and the thermal shielding body 5 changes its direction during and after the early stages of growth of the single crystal silicon 8. Dust attached to the thermal shielding body 5 may fall off when the amount of change in the velocity of the flow is large. The falling off dust goes down along the thermal shielding body 5, and then drops to the silicon melt.

Additionally, dust attached to an upper part of the furnace 1 may drop. The dust goes down to and along the thermal shielding body 5, and then drops to the silicon melt.

The dust dropping to the silicon melt results in contamination of the silicon melt. Especially, if the dust is incorporated during the growth of the crystal, single crystallization of the crystal is inhibited, which causes a problem of deteriorating quality of the single crystal silicon. Thus, it is necessary to prevent the dust from falling to the silicon melt.

The present invention is made in view of the above problem, and provides a solution to the problem by reducing the dust that falls to the silicon melt, and preventing deterioration in quality of the single crystal silicon.

Means to Solve the Problems

A first aspect of the present invention provides a single crystal silicon pulling device, comprising, in a furnace, a cylindrical body surrounding a pulling path of single crystal silicon and a thermal shielding body surrounding the cylindrical body, the single crystal silicon pulling device pulling up the single crystal silicon while supplying gas from an upper part to a lower part in the furnace, wherein the pulling path of the single crystal silicon, the cylindrical body and the thermal shielding body are arranged such that a velocity of a gas flow passing between a lower end of the cylindrical body and the thermal shielding body is set to a velocity at which dust is prevented from falling to silicon melt.

A second aspect of the present invention provides a single crystal silicon pulling device, comprising, in a furnace, a cylindrical body surrounding a pulling path of single crystal silicon and a thermal shielding body surrounding the cylindrical body, the single crystal silicon pulling device pulling up the single crystal silicon while supplying gas from an upper part to a lower part in the furnace, wherein, S2/S1 is 1.01 or lower, where S1 is a cross-sectional area of a plane perpendicular to a pulling axis of the single crystal silicon of an annular space formed by a side surface of the single crystal silicon and an inner wall surface of the cylindrical body, and S2 is an area of a side surface of a portion located between the cylindrical body and the thermal shielding body of a cylindrical space extending downward from a lower end of the cylindrical body.

The first and the second aspects of the present invention will be described.

Upon being supplied from above in the furnace of the single crystal silicon pulling device, the Ar gas goes down along the single crystal silicon. The Ar gas passing between a lower end of a cylindrical body and a thermal shielding body changes its direction during and after the early stages of growth of the single crystal silicon. However, if a velocity of the Ar gas flow passing between the lower end of the cylindrical body and the thermal shielding body is low, the amount of change in the flow velocity can be small even if the Ar gas changes its direction. Then, dust can be prevented from falling off from the thermal shielding body caused by the directional change in the Ar gas. Accordingly, the dust can be prevented from falling to the silicon melt.

The velocity of the Ar gas flow passing between the lower end of the cylindrical body and the thermal shielding body is affected by arrangement among a pulling path of the single crystal silicon, the cylindrical body and the thermal shielding body. Thus, by adjusting a relative position among the pulling path of the single crystal silicon, the cylindrical body and the thermal shielding body, the velocity of the Ar gas flow passing between the lower end of the cylindrical body and the thermal shielding body can be controlled.

Concretely, the arrangement among the pulling path of the single crystal silicon, the cylindrical body and the thermal shielding body is made such that S2/S1 is 1.01 or lower, assuming that S1 is a cross sectional area of a plane perpendicular to a pulling axis of the crystal of an annular space formed by a side surface of the single crystal silicon and an inner surface of the cylindrical body, and S2 is an area of a side surface of a portion located between the cylindrical body and the thermal shielding body of the cylindrical space extending downward from a lower end of the cylindrical body.

A third aspect of the present invention provides a method for preventing contamination of silicon melt for preventing dust from falling to the silicon melt caused by gas flowing down from an upper part in a furnace in a single crystal silicon pulling device that comprises, in the furnace, a cylindrical body surrounding a pulling path of single crystal silicon and a thermal shielding body surrounding the cylindrical body, the method comprising adjusting a relative position among the pulling path of the single crystal silicon, the cylindrical body and the thermal shielding body such that a velocity of a gas flow passing between a lower end of the cylindrical body and the thermal shielding body is set to a velocity at which the dust is prevented from falling to the silicon melt.

A fourth aspect of the present invention provides a method for preventing contamination of silicon melt for preventing dust from falling to the silicon melt caused by gas flowing down from an upper part in a furnace in a single crystal silicon pulling device that comprises, in the furnace, a cylindrical body surrounding a pulling path of single crystal silicon and a thermal shielding body surrounding the cylindrical body, the method comprising adjusting a relative position among the pulling path of the single crystal silicon, the cylindrical body and the thermal shielding body such that S2/S1 is 1.01 or lower, where S1 is a cross-sectional area of a plane perpendicular to a pulling axis of the single crystal silicon of an annular space formed by a side surface of the single crystal silicon and an inner wall surface of the cylindrical body, and S2 is an area of a side surface of a portion located between the cylindrical body and the thermal shielding body of a cylindrical space extending downward from a lower end of the cylindrical body.

The third aspect of the present invention is obtained by converting the first aspect of the present invention to a method invention. The fourth aspect of the present invention is obtained by converting the second aspect of the present invention to a method invention.

A fifth aspect of the present invention provides a device for preventing contamination of silicon melt for preventing dust from falling to the silicon melt from a thermal shielding body surrounding a pulling path of single crystal silicon, wherein, an upper opening of the thermal shielding body is larger than a lower opening; the thermal shielding body has a slope provided between the upper opening and the lower opening, the slope facing the pulling path of the single crystal silicon; and the slope has uneven portions with a height difference of about 0.5-10.0 mm.

The dust on the thermal shielding body is kept at uneven portions on a surface of the thermal shielding body, whereby the dust does not fall to the silicon melt. If the degree of unevenness is set to too large, the size of the thermal shielding body itself results in too large. Additionally, if the degree of unevenness is set to too small, the uneven portions do not perform sufficient function of keeping the dust. Thus, approximately 0.5-10.0 mm is appropriate.

A sixth aspect of the present invention provides a single crystal silicon pulling device that comprises, in a furnace, a thermal adjusting coil in which a pipe supplied with a medium for thermal adjusting is coiled in a helical shape with a pulling path of single crystal silicon being an approximate center, and a thermal shielding body surrounding the thermal adjusting coil, the single crystal silicon pulling device pulling the single crystal silicon while supplying gas from an upper part to a lower part in the furnace, wherein a coil complementary member is attached along a whole or part of a lower end of the thermal adjusting coil, and together with the thermal adjusting coil, forms a coil body; and intervals between any parts of a lower end of the coil body and the thermal shielding body are constant.

A thermal adjusting coil formed by a pipe in a helical shape has a height difference in its lower end. Therefore, a space between the lower end of the thermal adjusting coil and the thermal shielding body surrounding the thermal adjusting coil varies from place to place. To prevent such variations in the space, a coil complementary member for complementing the height difference is attached to the lower end of the thermal control coil in whole or in part. The coil complementary member and the thermal control coil are united into one to form a coil body. The space between the lower end of the coil body and the thermal shield body is almost unchanged in any parts. As a result, nonuniform gas flow does not occur in the space between the lower end of the coil body and the thermal shield body.

Effects of the Invention

According to the first to fourth aspects of the present invention, the velocity of the Ar gas flow passing between the lower end of the cylindrical body, such as the cooling coil, and the thermal shielding body can be reduced. Thus, the dust falling off from a surface of the thermal shielding body caused by change in the gas flow can be reduced. Accordingly, the dust falling to silicon melt can be reduced, thereby preventing deterioration in quality of the single crystal silicon.

According to the fifth aspect of the present invention, the dust falling from the upper part in a furnace to the thermal shielding body or dust on the thermal shielding body can be kept to the thermal shielding body. Thus, the dust falling off from the thermal shielding body to the silicon melt can be reduced, thereby preventing deterioration in quality of the single crystal silicon.

According to the sixth aspect of the present invention, the space between the lower end of the coil body and the thermal shielding body can be made unchanged over the entire part because a coil complementary member is attached to a lower end of a thermal control coil such as a cooling coil to form a coil body. Thus, nonuniform gas flow does not occur in the space between the coil body and the thermal shield body. Accordingly, fine dust accumulated in the upper part of the furnace is not caused to fall. This reduces the dust falling to the silicon melt, thereby preventing deterioration in quality of the single crystal silicon.

BEST MODE FOR CARRYING OUT THE INVENTION

Hereinafter, exemplary embodiments of the present invention will be described with reference to the drawings.

Example 1 relates to control of a gas flow passing between a lower end of a cooling coil and a thermal shielding body, and Examples 2 and 3 relate to a shape of the thermal shielding body.

Example 1

A device configuration in the present exemplary embodiment is the same as the single crystal pulling device 10 as shown in FIG. 1. However, they are different in that, in the present exemplary embodiment, arrangement among the thermal shielding body 5, the cooling coil 6 and the pulling path of the single crystal silicon 8 is determined based on areas S1, S2, which will be described later.

The relative position among the thermal shielding body 5, the cooling coil 6 and the pulling path of the single crystal silicon 8 is adjusted such that a velocity of a gas flow passing between the lower end 6a of the cooling coil 6 and the thermal shielding body 5 is set to a velocity at which dust does not fall off from the thermal shielding body 5. The positions are determined, for example, by obtaining an area ratio S2/S1, which will be described latter, in accordance with size and shape of each element when the single crystal pulling device 10 is manufactured.

By making at least one of the cooling coil 6 and the thermal shielding body 5 freely movable in an ascending and descending direction, the relative position of the cooling coil 6 and the thermal shielding body 5 may be changed as appropriate. In this case, the movement in the ascending and descending direction is controlled by a controller, which is not shown. It should be noted that, in the present exemplary embodiment, description will be made of a case where a cylindrical body surrounding the pulling path of the single crystal silicon 8 is the cooling coil 6. However, it may be possible to apply the present invention to a case where a heater or a purge tube is provided in place of the cooling coil 6.

FIGS. 2A through 2C are diagrams showing areas S1, S2 used in the present exemplary embodiment.

In the present exemplary embodiment, a relative position among the pulling path of the single crystal silicon 8, the cooling coil 6 and the thermal shielding body 5 is adjusted based on the areas S1, S2.

Between a side surface of the single crystal silicon and an inner surface of the cooling coil 6, an annular space 21 is formed. In FIG. 2B, a cross section 21a of a cross sectional part included in a plane perpendicular to an axis in the annular space 21 is shown. An area of the cross section 21a is set to S1. Next, a case where the cooling coil 6 extends downward is assumed. In such case, it is assumed that a cylindrical space 22 exists under the cooling coil 6. In FIG. 2C, a part 22a formed in the cylindrical space 22 and between the cooling coil 6 and the thermal shielding body 5 is shown. An area of a peripheral surface of the part 22a is set to S2.

The area S1 is determined based on a diameter of the single crystal silicon 8 to be pulled and a diameter of the cooling coil 6. The area S2 is determined based on a shape of the thermal shielding body 5 and a diameter of the cooling coil 6, and positions of the thermal shielding body 5 and the cooling coil 6. What is more important is not each value of the areas S1 and S2, but its ratio S2/S1 (or S1/S2).

Experimental data by the present inventors in connection with the area ratio S2/S1 is shown in table 1. The table 1 shows data in a case where a crystal with a diameter of 200 mm is pulled up.

TABLE 1

| S2/S1 | Effect |
| --- | --- |
| 1.15 | X |
| 1.01 | ○ |
| 0.8 | ○ |

Dust in silicon melt has an influence on quality of the single crystal silicon. More specifically, the dust inhibits single crystallization of the crystal. As the dust in the silicon melt increases, percentage of single crystallization of the generated crystal decreases while percentage of polycrystallization increases. In a case where the area ratio S2/S1 is 1.15, the percentage of single crystallization of the generated crystal was low, which was unacceptable for a product. In a case where the area ratio S2/S1 is less than 1.15 (1.01, 0.8), the percentage of single crystallization of the generated crystal was high. The present inventors consider that there is a threshold value between the area ratios S2/S1 of 1.01 and 1.15 determining whether or not the percentage of single crystallization of the generated crystal is acceptable as a product. Thus, by adjusting the relative position among the thermal shielding body 5, the cooling coil 6 and the pulling path of the single crystal silicon 8 such that the area ratio S2/S1 is less than 1.15 (preferably 1.01 or less), a crystal favorable for a product can be generated.

Although the table 1 shows data of a diameter of 200 mm, the same results can be obtained even in the crystal with other diameters.

FIGS. 3A and 3B are diagrams showing gas flows in a furnace in the present exemplary embodiment. FIG. 3A shows a gas flow during the early stages of growth of the single crystal silicon. FIG. 3B shows a gas flow after the early stages of growth of the single crystal silicon.

When Ar gas is supplied from above in the furnace in the present exemplary embodiment, the Ar gas flows down along the pulling path of the single crystal silicon 8. As shown in FIGS. 3A and 3B, if the area ratio S2/S1 is an appropriate value, a velocity of gas flow passing between the lower end 6*a* of the cooling coil 6 and the thermal shielding body 5 can be lowered. If the velocity of the Ar gas flow passing between the lower end 6*a* of the cooling coil 6 and the thermal shielding body 5 is low, the amount of change in the velocity is small even if the Ar gas changes its direction. Thus, dust falling off from the thermal shielding body 5 caused by the change in the Ar gas flow direction can be suppressed.

According to the present exemplary embodiment, the velocity of gas flow passing between a lower end of a cylindrical body such as a cooling coil and the thermal shielding body can be lowered. Thus, dust falling off from a surface of a thermal shielding body caused by the change in the gas flow direction can be reduced. Accordingly, the dust falling to the silicon melt can be reduced, thereby preventing deterioration in quality of the single crystal silicon.

Example 2

FIG. 4 is a cross sectional schematic view of a thermal shielding body.

In a thermal shielding body 55, a surface 55*a* on a side of a single crystal silicon 58 has an uneven shape. A height difference of the unevenness is set to an extent that the dust can be prevented from falling off along the surface 55*a* of the thermal shielding body 55. Specifically, it is approximately 0.5-10.0 mm.

According to the present exemplary embodiment, the dust falling from the upper part in the furnace to the thermal shielding body or the dust on the thermal shielding body can be kept to the thermal shielding body. Thus, the dust falling off from the thermal shielding body to the silicon melt can be reduced, thereby preventing deterioration in quality of the single crystal silicon.

Example 3

As shown in FIG. 6, the actual cooling coil 6 comprises a cooling pipe 6*b* that is coiled in a helical shape with the pulling path of the single crystal silicon 8 being the approximate center. In the cooling pipe 6*b*, cooling water, which is a cooling medium, is supplied from a cooling water supplying mechanism (not shown). As described above, when the cylindrical cooling coil 6 is formed by coiling the cooling pipe 6*b* in a helical shape, the lower end 6*a* of the cooling coil 6 becomes uneven. This results in a height difference L1-L2 with a size of up to one pipe. Accordingly, the space between the lower end 6*a* of the cooling coil 6 and the thermal shielding body 5 varies from place to place, causing the gas flow velocity to be nonuniform. As described above, if the gas flow passing between the lower end 6*a* of the cooling coil 6 and the thermal shielding body 5 becomes nonuniform, the fine dust (carbon dust and so on) accumulated on the upper portion in the furnace may be induced to fall down at the time when the gas flow changes with the pull of the single crystal silicon 8.

According to the present exemplary embodiment, to prevent the dust from falling due to the height difference as described above, a coil complementary member 61 is attached along a part of the lower end 6*a* of the cooling coil 6 as shown in FIG. 7A. The coil complementary member 61 has the same curvature as the cooling coil 6. The cooling coil 6 and the coil complementary member 61 are combined into one, and then the combined structure is called a coil body 60 here. The coil complementary member 61 complements the height difference of the lower end 6*a* of the cooling coil 6 to make a lower end of the coil body 60 almost flat. Any material may be employed for the coil complementary member 61, provided that the shape or quality of the single crystal silicon 8 is not adversely affected.

It may be possible to attach a coil complementary member 62 to the whole of the lower end 6*a* of the cooling coil 6 as shown in FIG. 7B in place of attaching the coil complementary member 61 to a part of the lower end 6*a* of the cooling coil 6 as shown in FIG. 7A.

Additionally, in the present exemplary embodiment, the coil complementary member 61 is provided to the cylindrical cooling pipe 6. However, it may be possible to provide the coil complementary member 61 to a cylindrical coil in which a thermal adjusting medium flows in a pipe having a helical shape.

According to the present exemplary embodiment, a coil body is formed by attaching a coil complementary member to a lower end of a thermal adjusting coil such as a cooling coil, whereby the entire space between the lower end of the coil body and a thermal shielding body can be made unchanged. Thus, nonuniform gas flow does not occur between the coil body and the thermal shielding body. Accordingly, fine dust accumulated in an upper part in the furnace is not induced to fall down, thereby preventing deterioration in quality of the single crystal silicon.

BRIEF DESCRIPTION OF THE DRAWINGS

FIGS. 2A through 2C are diagrams showing areas S1, S2 used in the first exemplary embodiment;

EXPLANATION OF REFERENCE NUMERALS

Figure 1:
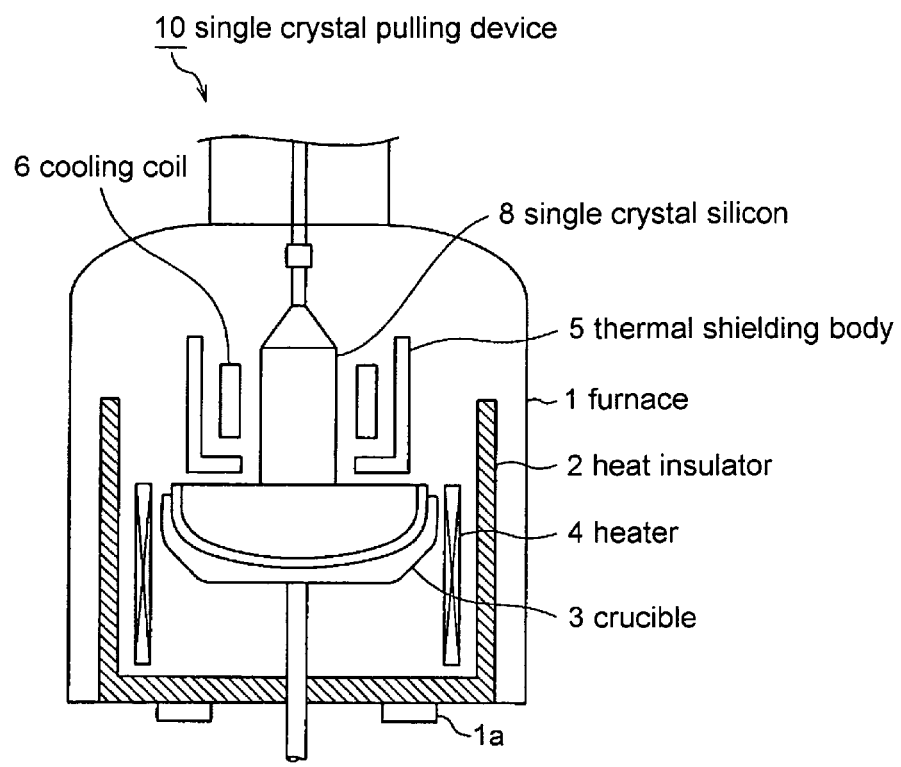
FIG. 1 is a schematic view of a single crystal silicon pulling device.
Figure 3A:
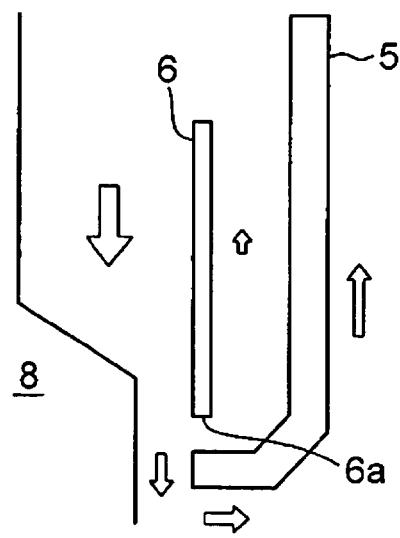
FIGS. 3A and 3B are diagrams showing gas flows in a furnace in the first exemplary embodiment.
Figure 3B:
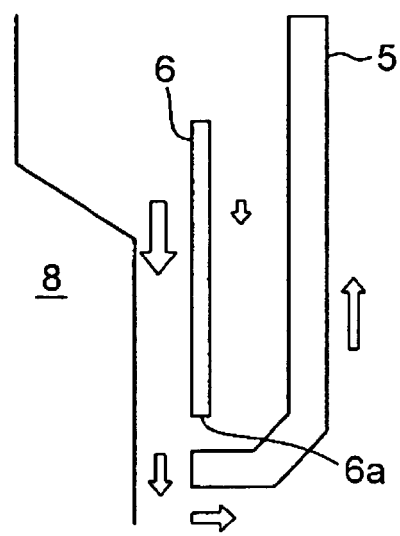
Figure 4:
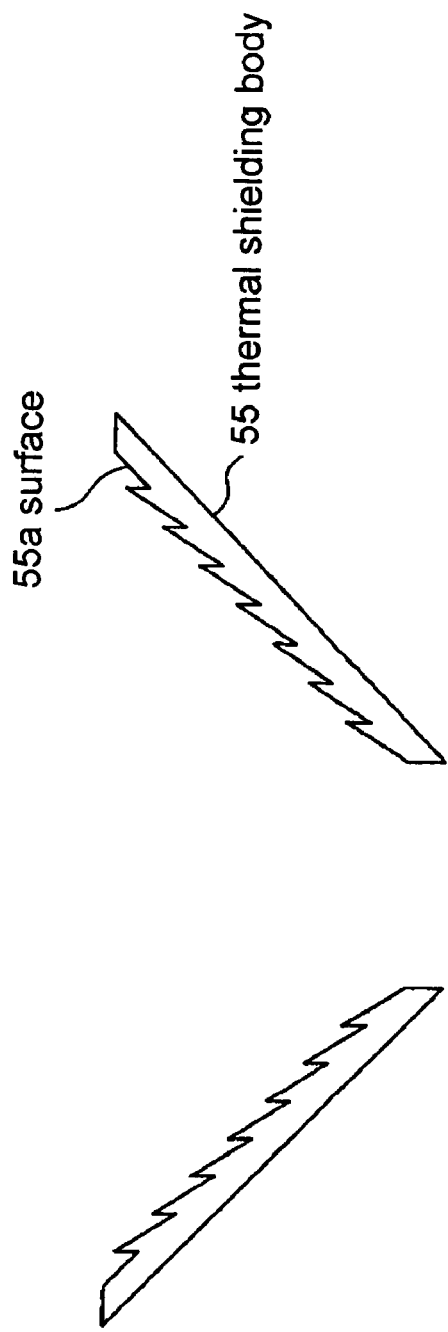
FIG. 4 a cross sectional schematic view of a thermal shielding body.
Figure 5A:
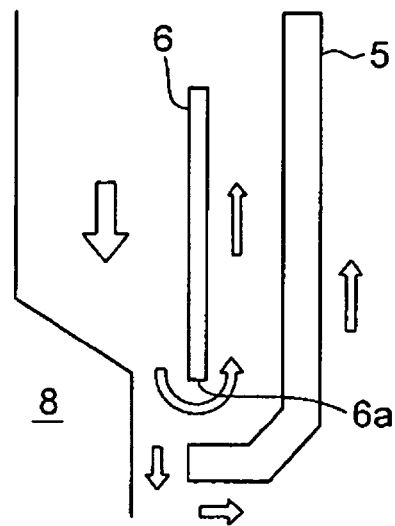
FIGS. 5A and 5B are diagrams showing gas flows in the general furnace.
Figure 5B:
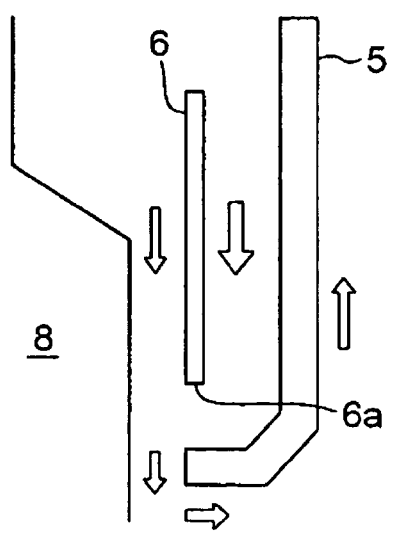
Figure 6:
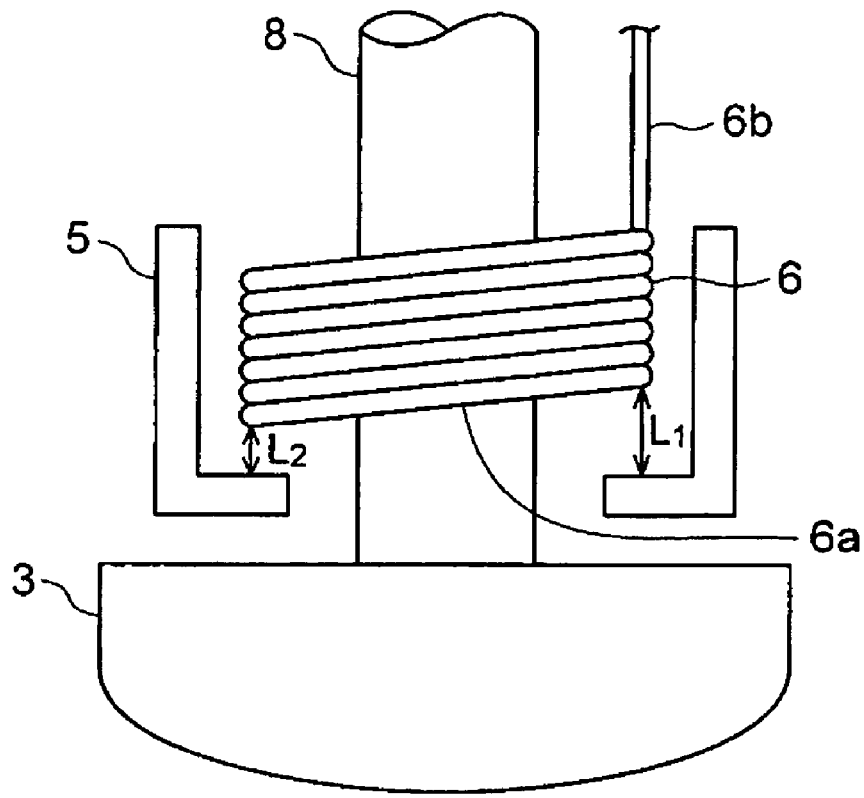
FIG. 6 is a schematic view of a general cooling coil.
Figure 7A:
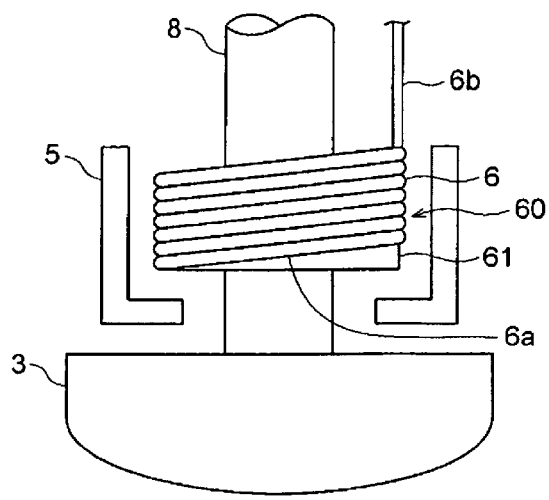
FIGS. 7A and 7B are schematic views of cooling coils to which coil complementary members are attached.
Figure 7B:
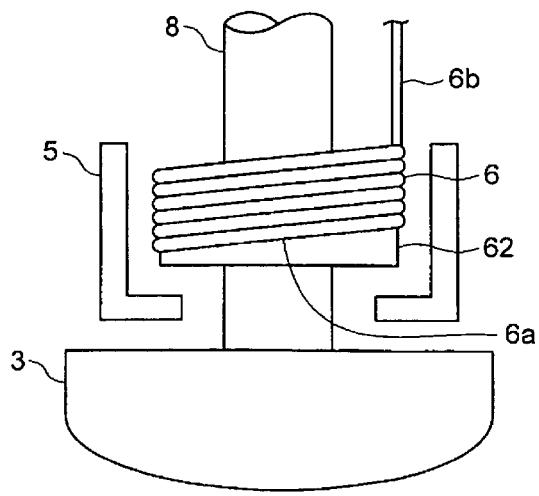

| | |
|---|---|
| 1 | furnace |
| 5, 45, 55 | thermal shielding body |
| 6 | cooling coil |
| 8 | single crystal silicon |
| 10 | single crystal pulling device |
| 60 | coil body |
| 61 | coil complementary member |

The invention claimed is:

1. A single crystal silicon pulling device, comprising, in a furnace, a cylindrical body surrounding a pulling path of single crystal silicon and a thermal shielding body surrounding the cylindrical body, the single crystal silicon pulling device pulling up the single crystal silicon while supplying gas from an upper part to a lower part in the furnace, the cylindrical body consisting of a thermal adjusting coiled pipe supplied with a medium for thermal adjusting coiled in a helical shape with a single crystal silicon pulling path of single crystal silicon being an approximate center, and a coil complementary member having an upper end being attached along a whole or part of a lower end of the thermal adjusting coiled pipe, and together with the thermal adjusting coiled pipe, forming a coil body to make constant intervals between any part of a lower end of the coil body and the thermal shielding body wherein, S2/S1 is 1.01 or lower, where S1 is a cross-sectional area of a plane perpendicular to a pulling axis of the single crystal silicon of an annular space formed by a side surface of the single crystal silicon and an inner wall surface of the cylindrical body, and S2 is an area of a side surface of a portion located between the cylindrical body and the thermal shielding body of a cylindrical space extending downward from a lower end of the cylindrical body.

2. A method for preventing contamination of silicon melt for preventing dust from falling to the silicon melt caused by gas flowing down from an upper part in a furnace in a single crystal silicon pulling device that comprises, in the furnace, a cylindrical body surrounding a pulling path of single crystal silicon and a thermal shielding body surrounding the cylindrical body, the method comprising adjusting a relative position among the pulling path of the single crystal silicon, the cylindrical body and the thermal shielding body such that S2/S1 is 1.01 or lower, where S1 is a cross-sectional area of a plane perpendicular to a pulling axis of the single crystal silicon of an annular space formed by a side surface of the single crystal silicon and an inner wall surface of the cylindrical body, and S2 is an area of a side surface of a portion located between the cylindrical body and the thermal shielding body of a cylindrical space extending downward from a lower end of the cylindrical body, the cylindrical body consisting of a thermal adjusting coil in which a pipe supplied with a medium for thermal adjusting is coiled in a helical shape with a single crystal silicon pulling path of single crystal silicon being an approximate center, and a coil complementary member having an upper end being attached along a whole or part of a lower end of the thermal adjusting coil, and together with the thermal adjusting coil, forming a coil body and making equal distances between any part of a lower end of the coil body and the thermal shielding body.

* * * * *